United States Patent
Kim et al.

(10) Patent No.: US 7,154,105 B2
(45) Date of Patent: Dec. 26, 2006

(54) METHOD OF EXPOSING USING ELECTRON BEAM

(75) Inventors: Hae-sung Kim, Geonggi-do (KR); Myung-bok Lee, Gyeonggi-do (KR); Jin-seung Sohn, Seoul (KR); Mee-suk Jung, Gyeonggi-do (KR); Eun-hyoung Cho, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/066,187

(22) Filed: Feb. 25, 2005

(65) Prior Publication Data

US 2005/0184258 A1 Aug. 25, 2005

(30) Foreign Application Priority Data

Feb. 25, 2004 (KR) ............... 10-2004-0012536

(51) Int. Cl.
*H01J 37/08* (2006.01)

(52) U.S. Cl. ............... 250/492.2; 250/492.1; 250/492.22; 250/492.21; 250/491.1; 250/396 R; 430/5; 430/296; 430/22; 430/30; 430/942

(58) Field of Classification Search ............ None
See application file for complete search history.

(56) References Cited

U.S. PATENT DOCUMENTS 5,874,198 A * 2/1999 Okino .............. 430/296
6,180,289 B1 * 1/2001 Hirayanagi ............ 430/5
6,657,210 B1 * 12/2003 Muraki ............ 250/492.22

FOREIGN PATENT DOCUMENTS

JP 2001-185477 A 7/2001

* cited by examiner

*Primary Examiner*—Jack Berman
*Assistant Examiner*—Zia R. Hashmi
(74) *Attorney, Agent, or Firm*—Sughrue Mion, PLLC

(57) ABSTRACT

Provided is a method of exposing using an electron beam. The provided method of exposing using the electron beam includes defining main fields on an exposure area of an electron beam exposure target and defining a plurality of sub-fields on the main fields, selecting a main field to be exposed, selecting at least one sub-field of the selected main field, exposing the selected sub-field by using the electron beam, and selecting at least one of the other sub-field, which is not adjacent to the previously selected sub-field and not exposed yet, and exposing the sub-field by using the electron beam.

17 Claims, 10 Drawing Sheets

METHOD OF EXPOSING USING ELECTRON BEAM

BACKGROUND OF THE INVENTION

This application claims the priority of Korean Patent Application No. 10-2004-0012536, filed on Feb. 25, 2004, in the Korean Intellectual Property Office, the disclosure of which is incorporated herein in its entirety by reference.

1. Field of the Invention

The present invention relates to a method of manufacturing a semiconductor device, and more particularly, to a method of exposing using an electron beam.

2. Description of the Related Art

Along with the development of a technology of manufacturing a semiconductor device, an equipment for manufacturing a semiconductor device is also improved. An example of the equipment for manufacturing a semiconductor device is an equipment for exposing using an electron beam. Nowadays, equipments of adopting various methods of exposing are introduced to improve productivity.

Examples of the introduced equipments include an equipment for changing the spot size of electron beams during an exposure, a projection type equipment, and an equipment to which an optical system of multi-electron beam type, multi-column type, and optical lithography type is adopted.

In an equipment for exposing using an electron beam, primary electrons, secondary electrons, and photons, in other words, an x-ray, are detected when the electron beam is injected into a specimen or a photosensitive layer. In addition, the electrons are scattered when the electron beam is injected into the specimen or the photosensitive layer. Here, such scattered electrons become obstacles when realizing fine patterns.

The electron scattering can be divided into two types like a forward scattering, which is generated in a photosensitive layer in the incidence direction of the electron beam, and a backward scattering, which is generated from a substrate.

The forward scattering affects the distribution of the electron beams in the photosensitive layer. Thus, when performing an exposure by using the electron beam, the photosensitive layer is mainly affected by the forward scattering than the backward scattering. Accordingly, the effective width of the electron beam is increased at a lower portion of the photosensitive layer.

The effect of the electron scattering is severe when patterns are adjacent.

For example, when the patterns to be exposed are adjacent, the electron beam exposure for one pattern affects the other pattern, which is located in an electron scattering area. In other words, the electron beam is injected to an area of the photosensitive layer where the electron beam is not to be injected, thus the pattern is distorted.

Such phenomenon is referred to as a proximity effect that can be divided into two types like an intra-proximity effect, which is generated within the same pattern, and an inter-proximity effect, which affects adjacent patterns.

The electron scattering also increases the temperatures of the inside and the surface of the photosensitive layer. When the temperatures of the inside and the surface of the photosensitive layer are increased, the exposing characteristic of the photosensitive layer is changed, thus, the pattern is distorted.

In the exposure by using the electron beam, an exposing area of the specimen or the photosensitive layer is divided into main fields, and the main fields are divided into a plurality of sub-fields. The main field denotes a maximum deflection area of the specimen or the photosensitive layer that may be exposed by scanning the electron beam once while a chuck is fixed. The sub-field denotes a numerical area of a pattern corresponding to 1 bit, when the minimum amount of signal information transferred by the equipment for exposing using the electron beam at once is 1 bit.

In a conventional method of exposing using an electron beam shown in FIG. 1, first through fourth main fields MF1, MF2, MF3, and MF4 defined in an exposing area 10 are exposed sequentially. In addition, sub-fields SF of each main field are sequentially exposed. For example, when exposing the first main field MF1, a first sub-field SF1 is exposed, a second sub-field SF2 is exposed, and a third sub-field SF3 is exposed. The exposure is performed until the last sub-field SFn is exposed. Arrows shown in the first main field MF1 denote the direction of progress of the exposure using the electron beam.

Since the sub-fields of the main field are sequentially exposed in the conventional method of exposure using the electron beam, the temperatures of the inside and the surface of the photosensitive layer are increased due to the electron scattering during the exposure of the sub-fields. As a result, the exposing characteristic of the photosensitive layer is changed, thus the pattern may be distorted. In other words, the numerical accuracy and precision of the pattern are deteriorated.

On the other hand, a software program for compensating the proximity effect is developed; however, the program compensates the minimum area of the proximity effect. In addition, the software program only compensates the size of the exposure pattern, and it is required to process a large amount of data to calculate a process shift amount for a portion deviated from the size of the exposure pattern. Furthermore, the software program cannot remove the proximity effect from a complicated pattern and an entire area of the pattern.

SUMMARY OF THE INVENTION

The present invention provides a method of exposing using an electron beam for improving numerical accuracy and precision between an initial designed pattern and a pattern, which is obtained by exposing, and for realizing the pattern having desired shape and structure, by removing a proximity effect and a heat generation problem that occur due to an electron scattering.

According to an aspect of the present invention, there is provided a method of exposing using an electron beam. The method comprises defining main fields on an exposure area of an electron beam exposure target and defining a plurality of sub-fields on the main fields, selecting a main field to be exposed, selecting at least one sub-field of the selected main field, exposing the selected sub-field by using the electron beam, and selecting at least one of the other sub-field, which is not adjacent to the previously selected sub-field and not exposed yet, and exposing the sub-field by using the electron beam.

The selecting of at least one sub-field, the exposing of the selected sub-field, and the selecting of at least one of the other sub-field may be repeated until all the sub-fields of the selected main field are exposed using the electron beam.

The selecting of at least one sub-field of the selected main field may include selecting two adjacent sub-fields.

The selecting of at least one of the other sub-field may include selecting the other sub-field, which is separated from the previously selected sub-field by at least one sub-field.

The selecting of at least one of the other sub-field may include selecting a sub-field that is located in a diagonal direction of the previously selected sub-field.

The plurality of sub-fields may form a matrix. Here, the exposure using the electron beam may be performed in the same direction for each row or in the opposite directions for two adjacent rows. In addition, the exposure using the electron beam may be alternately performed for two adjacent rows.

A portion of the sub-fields may be sequentially exposed by using the electron beam.

The selecting of at least one of the other sub-field may include randomly selecting the sub-fields from the plurality of sub-fields.

According to another aspect of the present invention, there is provided a method of exposing using an electron beam comprising defining main fields on an exposure area of an electron beam exposure target and defining a plurality of sub-fields on the main fields, and sequentially exposing at least a potion of the plurality of sub-fields with a time difference longer than a typical time difference of an equipment for exposing using an electron beam between two adjacent sub-fields.

Here, a portion of the sub-fields that are sequentially exposed may be exposed with a time difference same as the typical time difference. In addition, a potion of the plurality of sub-fields may be not sequentially exposed.

According to still another aspect of the present invention, there is provided a method of exposing using an electron beam comprising defining main fields on an exposure area of an electron beam exposure target and defining a plurality of sub-fields on the main fields, defining the plurality of sub-fields as a plurality of independent or repeating pattern files and assigning coordinates to the patterns, and appointing one coordinates and exposing the appointed coordinates by using the electron beam to form a pattern corresponding to the appointed coordinates.

The method further comprises appointing another coordinate, which is separated from the previously appointed coordinate and different from the previously appointed coordinate, exposing the another appointed coordinate to form a pattern corresponding to the another coordinate, and repeating the appointing the another coordinate and the exposing the another appointed coordinate until all the sub-fields are exposed. In addition, a portion of the plurality of sub-fields may be sequentially exposed, or separately and not repeatedly exposed without the pattern files.

According to a further aspect of the present invention, there is provided a method of exposing using an electron beam. The method comprising defining main fields on an exposure area of an electron beam exposure target and defining a plurality of sub-fields on the main fields, defining the plurality of sub-fields as a plurality of independent or repeating pattern files and assigning coordinates to the patterns, and appointing a first coordinates and exposing sub-field corresponding to the first coordinates by using the electron beam to form a pattern corresponding to the first coordinates. The method also includes appointing a second coordinates separate and different from the first coordinates, exposing sub-fields corresponding to the second coordinates to form a pattern corresponding to the second coordinates, and repeating the appointing of the second coordinates and the exposing the sub-fields corresponding to the second coordinates until all the sub-fields are exposed.

The method of exposing using the electron beam according to the present invention can improve a proximity effect and the generation of heat by an electron scattering when patterning a photosensitive layer into a predetermined shape by using the electron beam. Thus, the accuracy and the precision of the patterns may be secured. In addition, the method of exposing using the electron beam according to the present invention may be applied to various equipments of exposing using an electron beam. Furthermore, the method of exposing using the electron beam can precisely form fine and complicated patterns, thus the method can realize fine patterns of various shapes.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
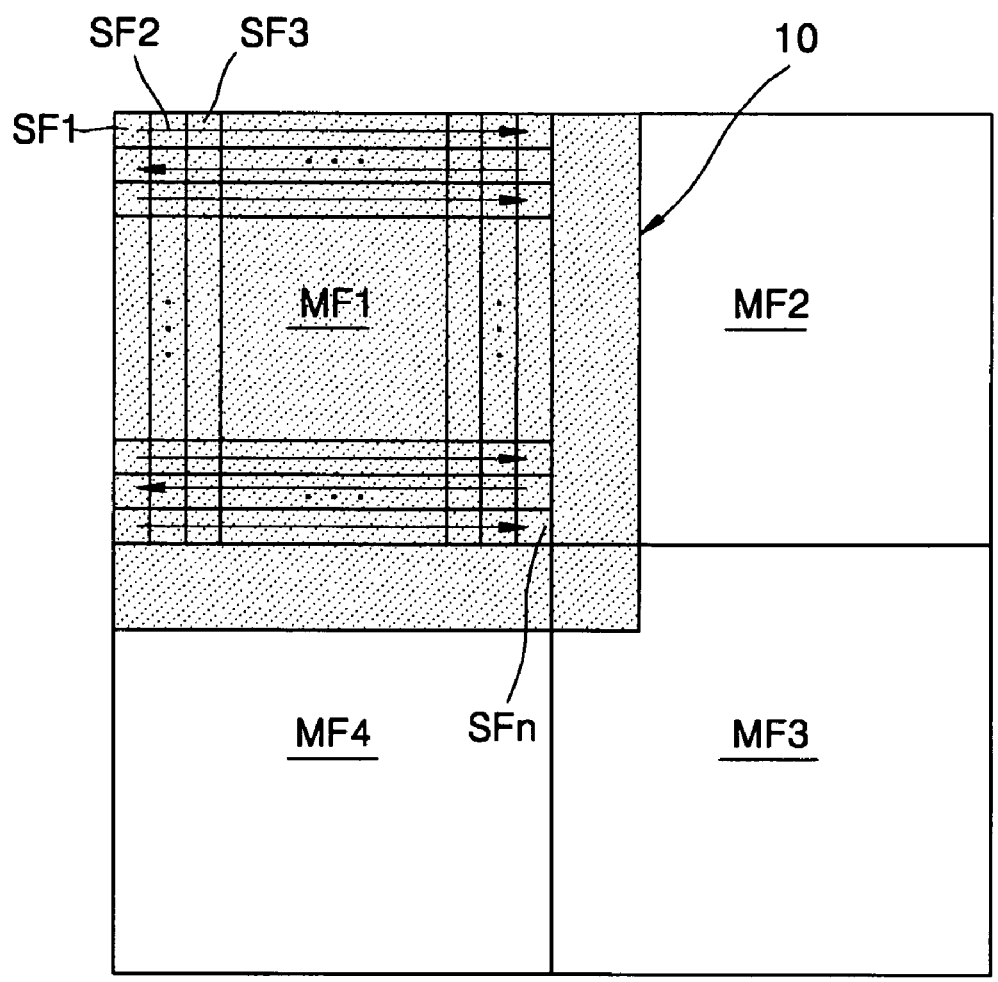
FIG. 1 is a plain view illustrating a conventional method of exposing using an electron beam.

The present invention will now be described more fully with reference to the accompanying drawings, in which exemplary embodiments of the invention are shown. In the drawings, the thicknesses of layers and regions are exaggerated for clarity.

The characteristic of a method of exposing using an electron beam according to the present invention is that sub-fields included in main fields are exposed separately or not sequentially.

In the description of the present invention, six sub-fields are located in a lateral direction and a vertical direction of one main field, in other words, 36 sub-fields are located in one main field. In addition, the locations of the sub-fields are denoted by a matrix type, for example, (X, Y). For example, a sub-field referred to as (2, 3) denotes the sub-field located at a second row of a third column.

The number of sub-fields located in one main field does not affect the scope of the present invention.

A method of exposing using an electron beam according to a first embodiment of the present invention will now be described with reference to FIG. 2.

Figure 2:
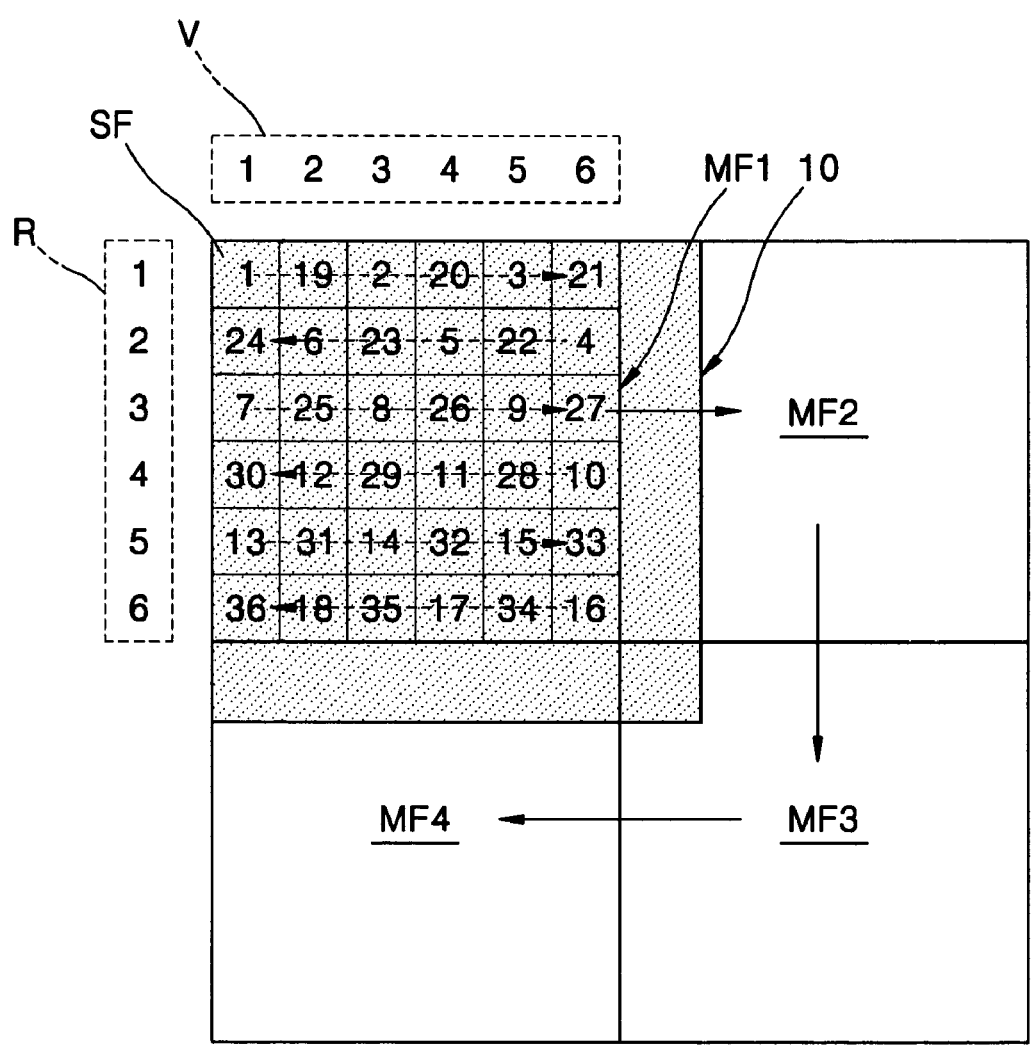
FIGS. 2 through 5 are plain views illustrating methods of exposing using an electron beam according to first through fourth embodiments of the present invention.

Referring to FIG. 2, a specimen or a photosensitive layer 10 to be exposed is divided into first through fourth main fields MF1, MF2, MF3, and MF4. Here, the number of the main fields can vary based on the area to be exposed. For example, in the case of the photosensitive layer 10 is smaller than the first main field MF1, first main field MF1 is enough for the photosensitive layer 10. On the contrary, in the case of the photosensitive layer 10 is larger than the size of the first through fourth main fields MF1 through MF4, the number of fields more than four are required for the photosensitive layer 10. Exposing processes on the first through fourth main fields MF1 through MF4 are the same except exposure area. Thus, only the description of the exposure of the first main field MF1 is described below and descriptions of the exposure of the second through fourth main fields MF2 through MF4 will be omitted.

After the photosensitive layer 10 is divided into the first through fourth main fields MF1 through MF4, the first main field MF1 is divided to 36 sub-fields. Reference characters R and V of FIG. 2 denote the groups of numbers denoting the row and the column of the first main field MF1, respectively. The numbers marked on the sub-fields of the first main field MF1 denote the exposure order of the sub-fields by using an electron beam. For example, the sub-field marked with number 10 means that the sub-field is exposed in tenth order. Thus, the progressing pattern of the exposure using the electron beam is shown with reference to the arrangement of the numbers marked on the sub-fields.

In the method of exposing using the electron beam according to the first embodiment of the present invention, which will be referred to as a first exposing method according to the present invention hereafter, the exposure using the electron beam of the first main field MF1 is started from the sub-field located at (1, 1), in other words, a first sub-field. After exposing the sub-field located at (1, 1) by using the electron beam, exposure for the sub-field located at (1, 2), in other words, a second sub-field, is skipped. Then, the exposure using the electron beam is performed on the sub-field located at (1, 3), in other words, a third sub-field. Thereafter, the exposure of the sub-field located at (1, 4), in other words, a fourth sub-field, is skipped, and the sub-field located at (1, 5), in other words, a fifth sub-field, is exposed. Next, the sub-field located at (1, 6) is skipped, and the electron beam exposure for the sub-field located at (2, 6) is performed. Then, the electron beam exposure is performed on the sub-fields of a second row in a direction opposite to the electron beam exposure direction of a first row. The electron beam exposure is performed on the sub-fields of the second row by skipping one sub-field for each sub-field like the electron beam exposure for the first row. In other words, after the sub-field located at (2, 6) is exposed, the sub-fields located at (2, 5), (2, 3), and (2, 1) are skipped. Then, the sub-fields located at (2, 4) and (2, 2) are sequentially exposed by using the electron beam. Thereafter, the electron beam exposures are performed on the sub-fields of third, fourth, fifth, and sixth rows in the same manner as the first and second rows.

Then, the electron beam exposures are performed on the skipped sub-fields from the first row to the sixth row. Here, the sub-fields on which the electron beam exposures are performed previously are skipped.

For example, the sub-field located at (1, 1) was already exposed, so that the sub-field located at (1, 1) is skipped. Thus, the electron beam exposure is performed on the sub-field located at (1, 2). In the same manner, the sub-fields located at (1, 3) and (1, 5) are skipped, and the sub-fields located at (1, 4) and (1, 6) are exposed sequentially.

Next, the electron beam exposures are performed on the sub-fields of the second row that are not exposed beforehand, in a direction opposite to the electron beam exposure direction of the first row. In other words, a $22^{nd}$ exposure using the electron beam is performed on the sub-field located at (2, 5). Then, the exposures of the sub-fields located at (2, 4) and (2, 2) are skipped, because the sub-fields are exposed fifthly and sixthly, and a $23^{rd}$ exposure and a $24^{th}$ exposure are performed on the sub-fields located at (2, 3) and (2, 1). The sub-fields of the third row through the sixth row that are not exposed before are exposed, not sequentially, in the same manner as the exposures of the first and second rows.

After completing the exposure of the first main field MF1, a chuck (not shown) on which the photosensitive layer 10 is placed, is transferred to locate a second main field MF2 to the location of the first main field MF1, in order to expose the second main field MF2 using the electron beam. The same exposure process as exposure process performed on the second main field MF2 is performed on a third main field MF3 and a fourth main field MF4.

Arrows of FIG. 2 denote the progress directions of the electron beam exposure on each row.

A method of exposing using an electron beam according to a second embodiment of the present invention will now be described.

In the method of exposing using the electron beam according to the second embodiment of the present invention, each row is exposed in the same direction.

More specifically, in the first exposing method according to the present invention, the exposure direction of the first, third, and fifth rows is opposite to the exposure direction of the other rows.

However, in the method of exposing using the electron beam according to the second embodiment of the present invention that will be referred to as a second exposing method according to the present invention, the exposure direction is the same for every row while skipping one sub-field for each sub-field.

Figure 3:
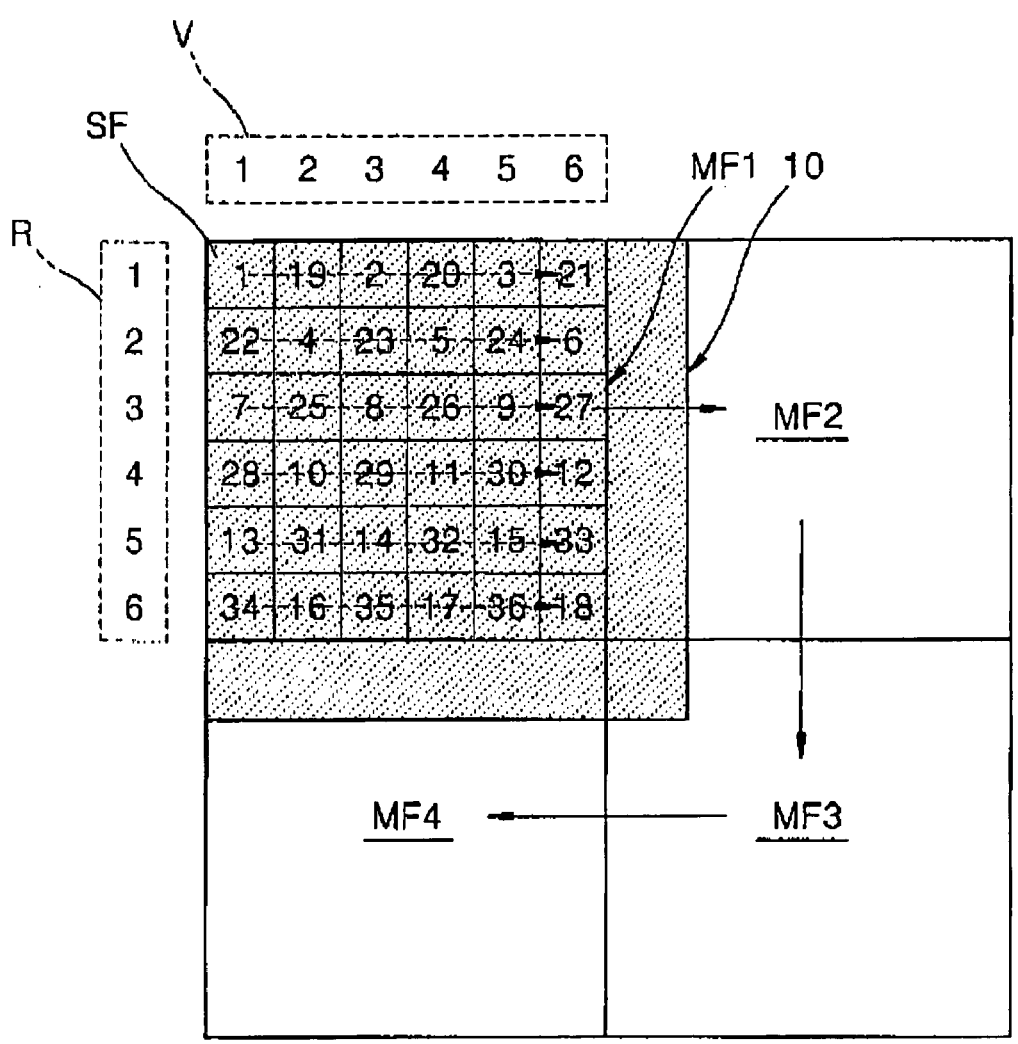

The second exposing method according to the present invention can be clear by referring numbers marked on the sub-fields SF of FIG. 3.

Specifically, after exposing sub-fields located at (1, 1), (1, 3), and (1, 5), the sub-fields of a second row are exposed in the same direction as a first row. Thus, a fourth exposure is performed on the sub-field located at (2, 2), then the sub-fields located at (2, 4) and (2, 6) are exposed sequentially. The progress direction of the electron beam exposure for a third row through a sixth row is the same as the progress direction of the electron beam exposure for the first row.

When referring to the numbers marked on the sub-fields SF of FIG. 3, the progress directions of the electron beam exposures for the sub-fields SF of each row that are not exposed in the first time electron beam exposure for the first main field MF1 are all the same.

For example, after exposing the sub-fields located at (1, 2), (1, 4), and (1, 6) of the first row in $19^{th}$, $20^{th}$, and $21^{st}$ orders, a $22^{nd}$ exposure is performed on the sub-field located at (2, 1) of the second row. Then, the sub-fields located at (2, 3) and (2, 5) are exposed in $23^{rd}$ and $24^{th}$ orders, respectively. Thus, the progress direction of the exposure of the second row is the same as that of the first row.

Arrows of FIG. 3 denote the progress directions of the electron beam exposures for rows.

When comparing FIG. 2 with FIG. 3, it is known that the progress directions of the electron beam exposures for the second, fourth, and sixth rows are opposite in the first and second exposing methods.

A method of exposing using an electron beam according to a third embodiment of the present invention will now be described.

In the method of exposing using the electron beam according to the third embodiment, sub-fields to be exposed are randomly selected while preventing adjacent sub-fields from being selected and one sub-field from being selected repeatedly.

In other words, the method of exposing according to the third embodiment of the present invention that will be referred to as a third exposing method according to the present invention randomly selects the sub-fields to be exposed.

The random selection of the sub-fields can be possible by programming an equipment for exposing using an electron beam. By the programming, random numbers are generated using meshing and grouping and the sub-fields corresponding to the random numbers are exposed. Here, it is not preferable that the adjacent sub-fields are sequentially selected and one sub-field are repeatedly selected.

Thus, any one of 36 sub-fields may be exposed first in the third exposing method according to the present invention. For example, a first exposure may be performed on the sub-field located at (1, 1), (6, 6), or in the middle.

Figure 4:
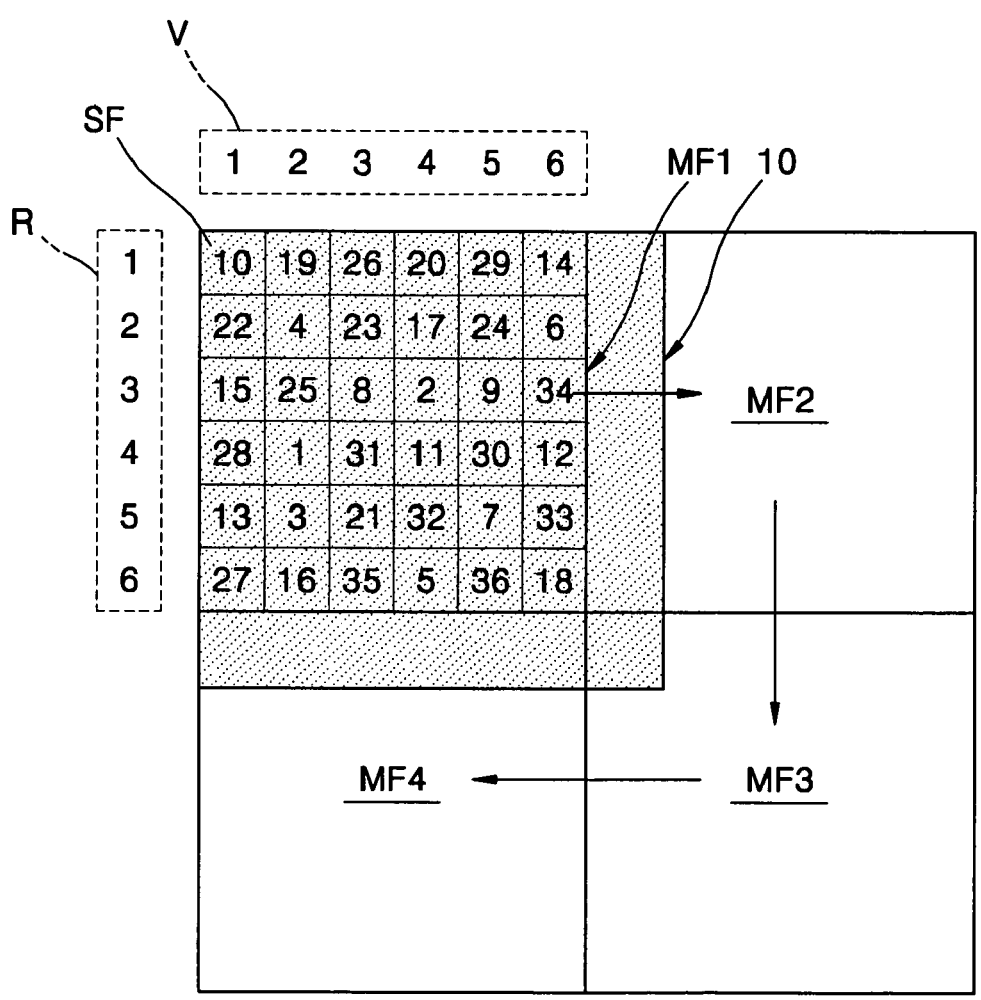

More specifically, referring to FIG. 4, the first exposure using the electron beam is performed on the sub-field located at (4, 2). Then, a second exposure is performed on the sub-field located at (3, 4), and a third exposure is performed on the sub-field located at (5, 2). Since the exposed sub-fields are randomly selected, no rule other than a random rule is applied to the third exposing method. The sub-fields to be exposed next to a fourth exposure through a $36^{th}$ exposure are also randomly selected.

A method of exposing using an electron beam according to a fourth embodiment of the present invention will now be described.

In the method of exposing using the electron beam according to the fourth embodiment, sub-fields of two rows are alternately exposed. Here, the progress directions of the exposures are zigzag.

Figure 5:
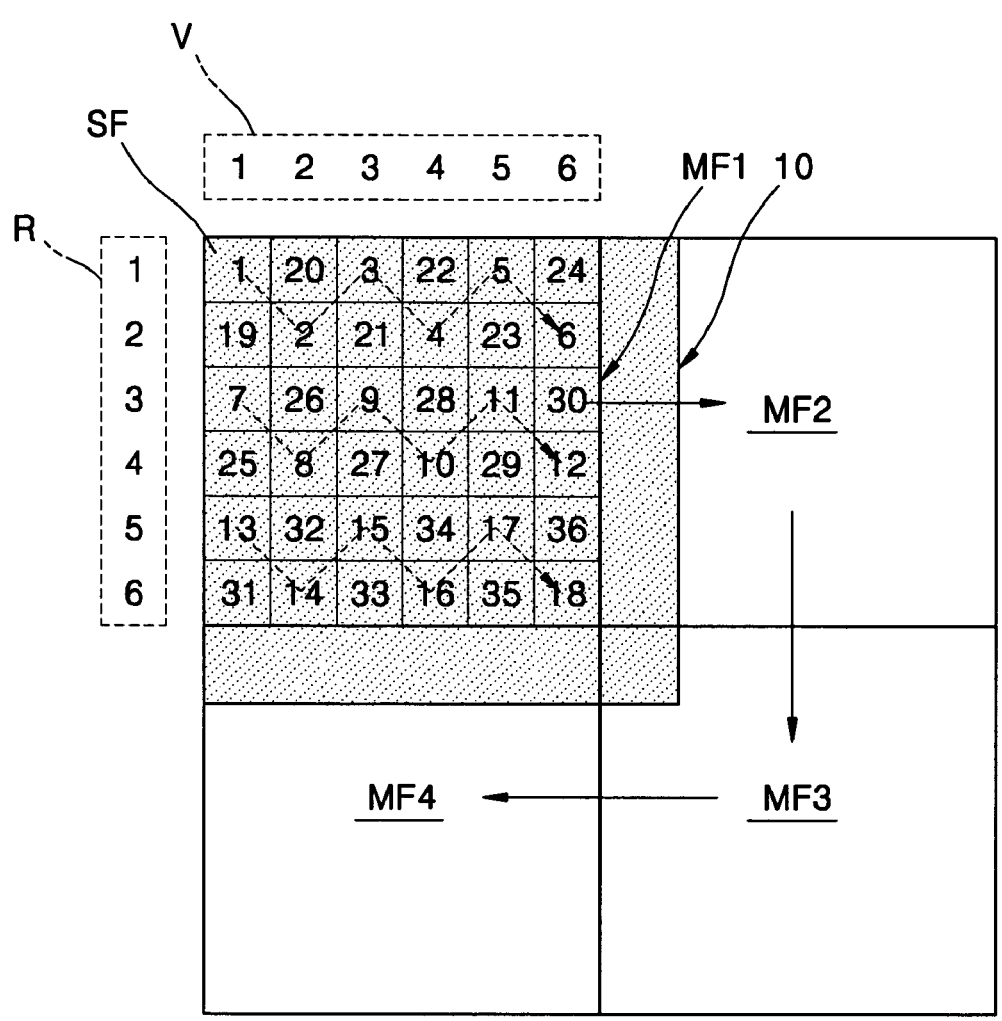

More specifically, referring to FIG. 5, in the method of exposing using the electron beam according to the fourth embodiment that will be referred to as a fourth exposing method according to the present invention, the sub-field located at (1, 1) is exposed first. Then, the sub-field located at (2, 2) that is in a slant direction of the sub-field located at (1, 1) is exposed. Next, the sub-field located at (1, 3) that is in a slant direction of the sub-field located at (2, 2) is exposed. Thereafter, the sub-field located at (2, 4) that is in a slant direction of the sub-field located at (1, 3) is exposed. In the same manner, the sub-field located at (1, 5) and the sub-field located at (2, 6) are exposed. The sub-fields of a third row through a sixth row are exposed in the same manner. The order of the exposures of the sub-fields is clear when referring to numbers marked on the sub-fields and dotted arrows in FIG. 5.

In the fourth exposing method according to the present invention shown in FIG. 5, the exposure is started from the first sub-fields of each row; however, the progress directions of exposure for adjacent rows may be opposite as in the case of the first exposing method according to the present invention. For example, the progress direction of the exposures of the first and second rows may be opposite from that of the third and fourth rows, in FIG. 5.

A method of exposing using an electron beam according to a fifth embodiment of the present invention will now be described.

In the method of exposing using the electron beam according to the fifth embodiment, sub-fields in a main field are continuously or sequentially exposed with a time difference between the sub-fields.

Figure 6:
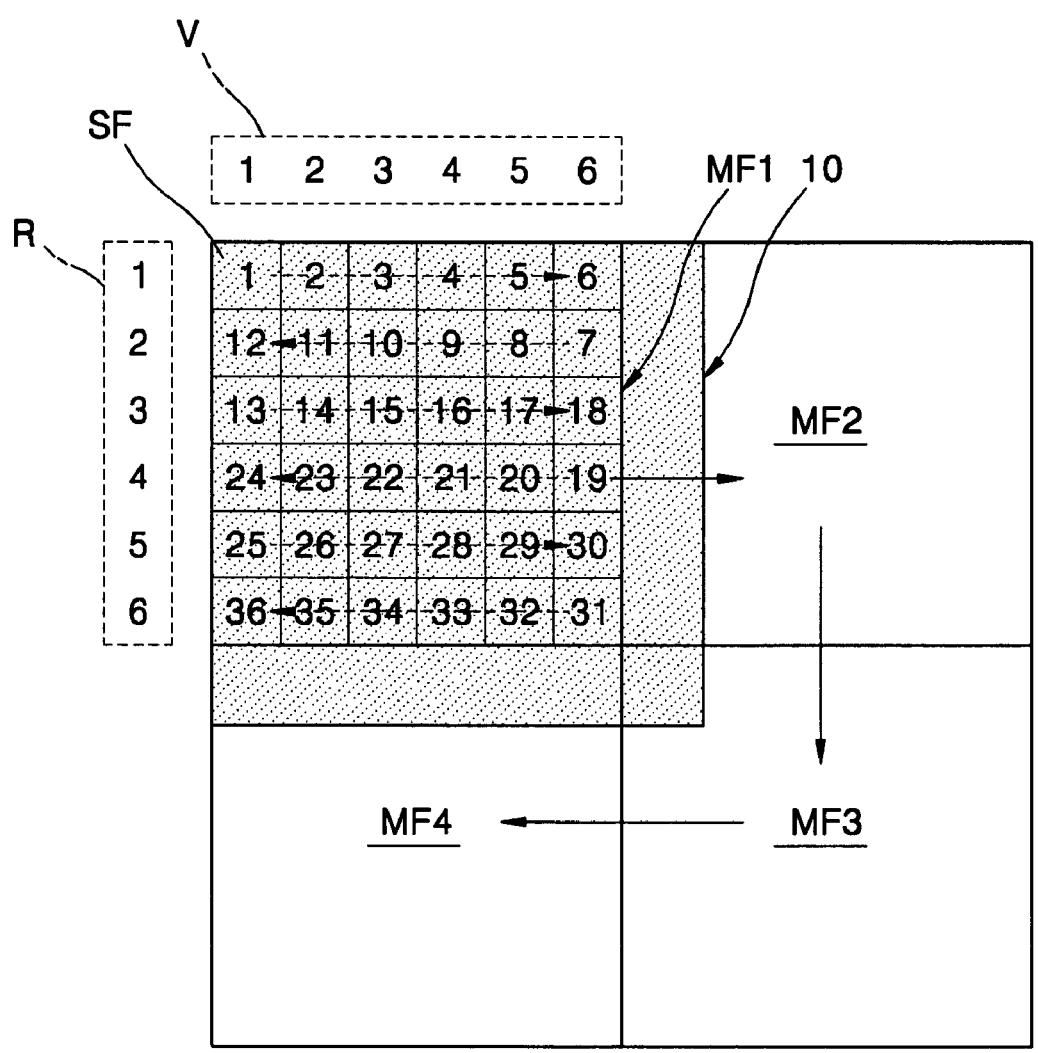
FIGS. 6 and 7 are plain views illustrating a method of exposing using an electron beam according to a fifth embodiment of the present invention.

Referring to FIG. 6, the method of exposing using the electron beam according to the fifth embodiment that will be referred to as a fifth exposing method according to the present invention exposes the sub-fields sequentially. However, a time difference exists between exposures of the adjacent sub-fields.

For example, a time difference of At exists between the end of the exposure of the sub-field located at (1, 1) and the start of the exposure of the sub-field located at (1, 2). Here, the time difference At is longer than a time difference between two adjacent sub-fields in a conventional method of exposing using an electron beam.

Due to the time difference At between exposures of the adjacent sub-fields, a pattern distortion due to the increase in the temperatures of the inside and the surface of a photosensitive layer 10 can be reduced.

The method of exposing with a time difference between exposures of adjacent sub-fields can be applied to the firth through fourth exposing methods according to the present invention.

Figure 7:
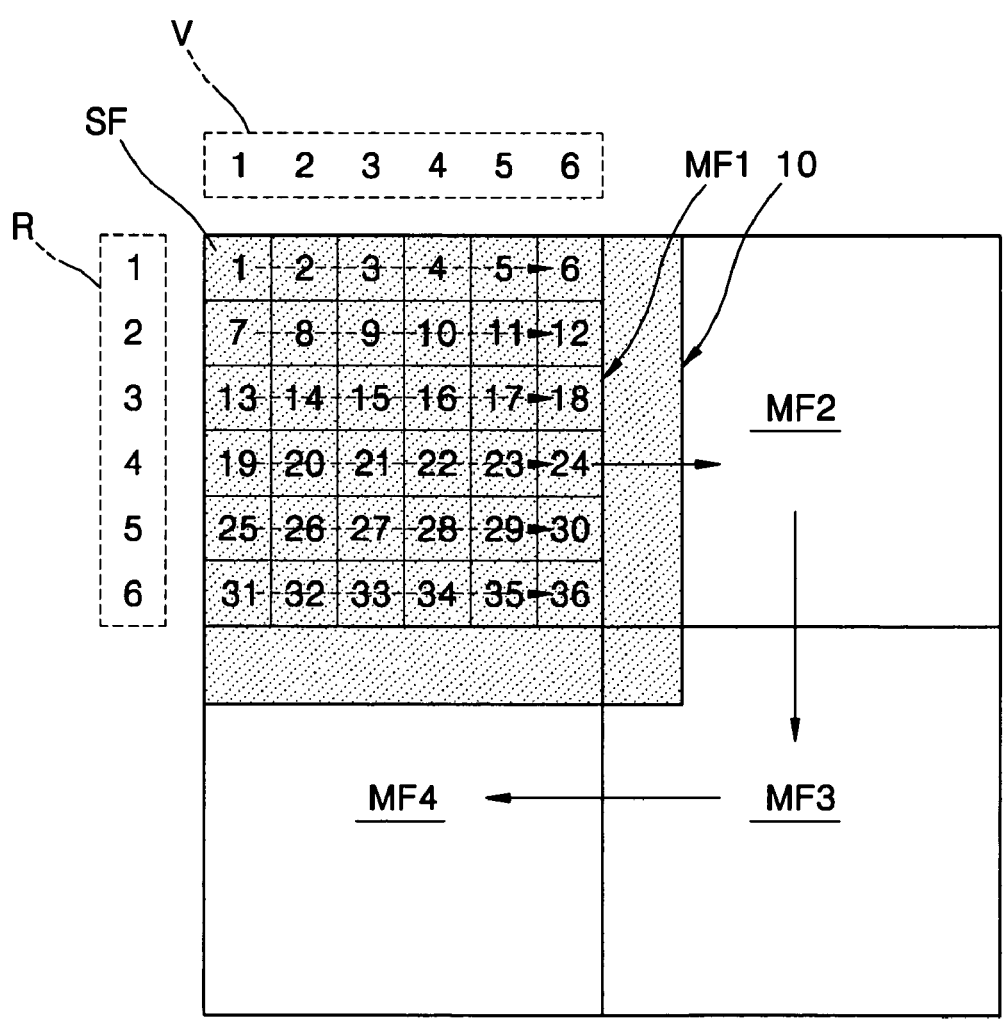

On the other hand, the exposure directions of each row may be opposite from the adjacent row as shown in FIG. 6; however, the exposure directions for each row may be the same as shown in FIG. 7.

A method of exposing using an electron beam according to a sixth embodiment of the present invention that will be referred to as a sixth exposing method according to the present invention will now be described. In the case where the size of patterns to be exposed is small or a same pattern is repeatedly formed, sub-fields of a main field are defined as a plurality of independent or repeating pattern files, then exact coordinates are assigned to the patterns. Thereafter, coordinates are appointed randomly or separately in order to perform electron beam exposures to form the pattern on the appointed coordinates. The result of the sixth exposing method according to the present invention is the same as the result of the exposure of the sub-fields, which correspond to the pattern files to which the appointed coordinates are assigned.

On the other hand, a method of exposing using an electron beam may be performed by mixing the first through sixth exposing methods according to the present invention.

For example, a first main field MF1 is exposed by the first or the second exposing method according to the present invention, a second main field MF2 is exposed by the third exposing method according to the present invention, and a third main field MF3 is exposed by the fourth exposing method according to the present invention. Then, a fourth main field MF4 is exposed by the fifth exposing method according to the present invention.

Figure 8:
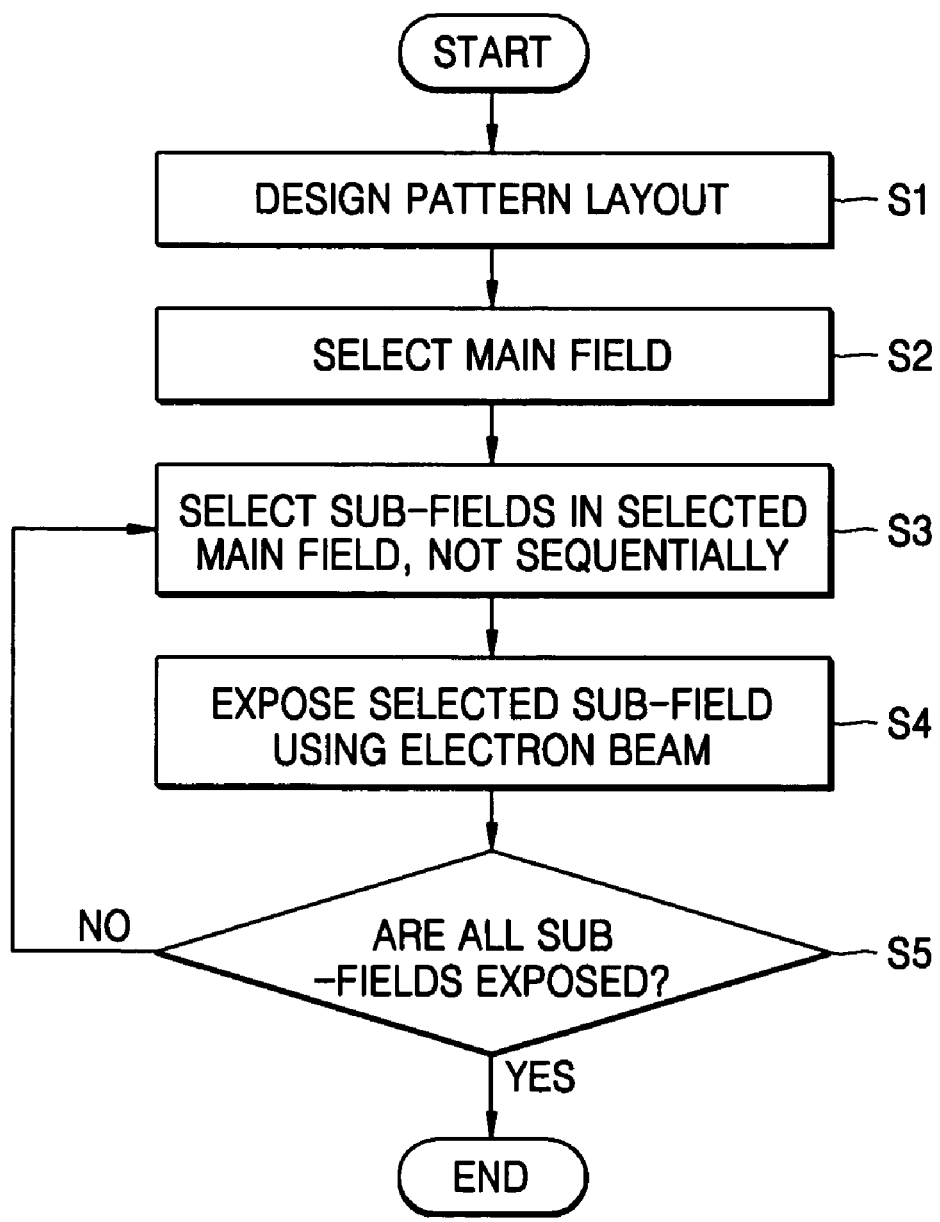
FIG. 8 is a flowchart of methods of exposing using an electron beam according to the first through fourth embodiments of the present invention.

FIG. 8 is a flowchart illustrating the first through fourth exposing methods according to the present invention.

Referring to FIG. 8, a pattern layout is designed, in step S1. In other words, main fields are defined on a specimen or a photosensitive layer to be exposed, and sub-fields are defined on the defined main fields.

A main field to be exposed is selected, in S2. In other words, the main field to be first exposed is selected from the main fields.

One sub-field to be exposed is selected separately or not sequentially, in S3.

In other words, the sub-fields may be selected by skipping one sub-field for each sub-field as in the first exposing method according to the present invention, shown in FIG. 2. The sub-fields may be randomly selected as long as not selecting adjacent sub-fields sequentially or selecting one sub-field repeatedly as in the third exposing method according to the present invention, shown in FIG. 4. The sub-fields may be alternately selected from two rows as in the fourth exposing method according to the present invention, shown in FIG. 5.

An electron beam exposure is performed on the sub-field selected in S3, in S4.

It is determined whether all the sub-fields in the selected main field are exposed, in S5.

When all the sub-fields are exposed (Y), the exposure is ended. However, when a sub-field to be exposed is remained (N), the processes of the steps S3 and S4 are repeated until all the sub-fields in the selected main field are exposed.

Figure 9:
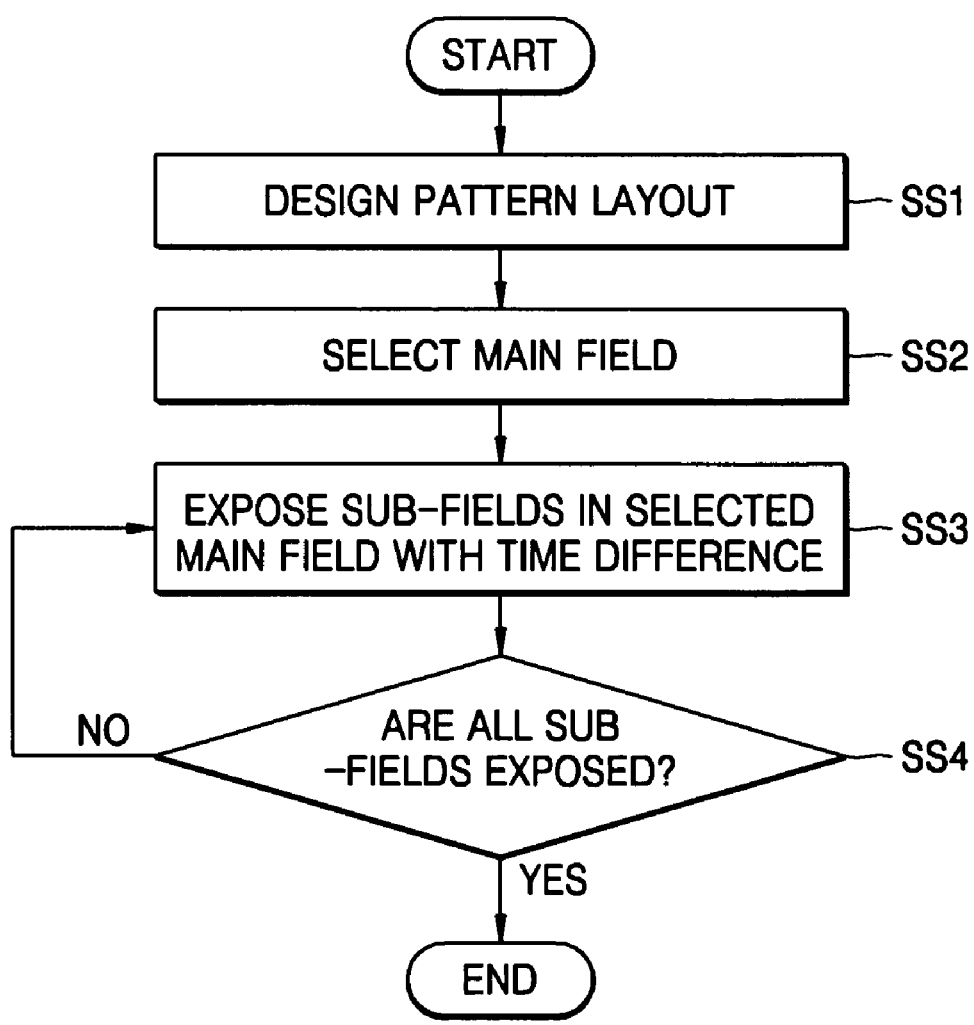
FIGS. 9 and 10 are flowcharts of methods of exposing using an electron beam according to the fifth and sixth embodiments of the present invention.

FIG. 9 is a flowchart illustrating the fifth exposing method according to the present invention.

Referring to FIG. 9, a pattern layout is designed, in SS1. In SS1, main fields are defined on a specimen or a photosensitive layer to be exposed, and sub-fields are defined on the defined main fields.

A main field to be exposed is selected, in SS2.

An exposure with a time difference is performed on the adjacent sub-fields of the selected main field, in SS3. Here, the time difference may be longer than a time difference of a conventional method of exposing using an electron beam.

It is determined whether all the sub-fields in the selected main field are exposed, in SS4.

When all the sub-fields are exposed (Y), the exposure is ended. However, when a sub-field to be exposed is remained (N), the process of the step SS3 is repeated until all the sub-fields in the selected main field are exposed.

Figure 10:
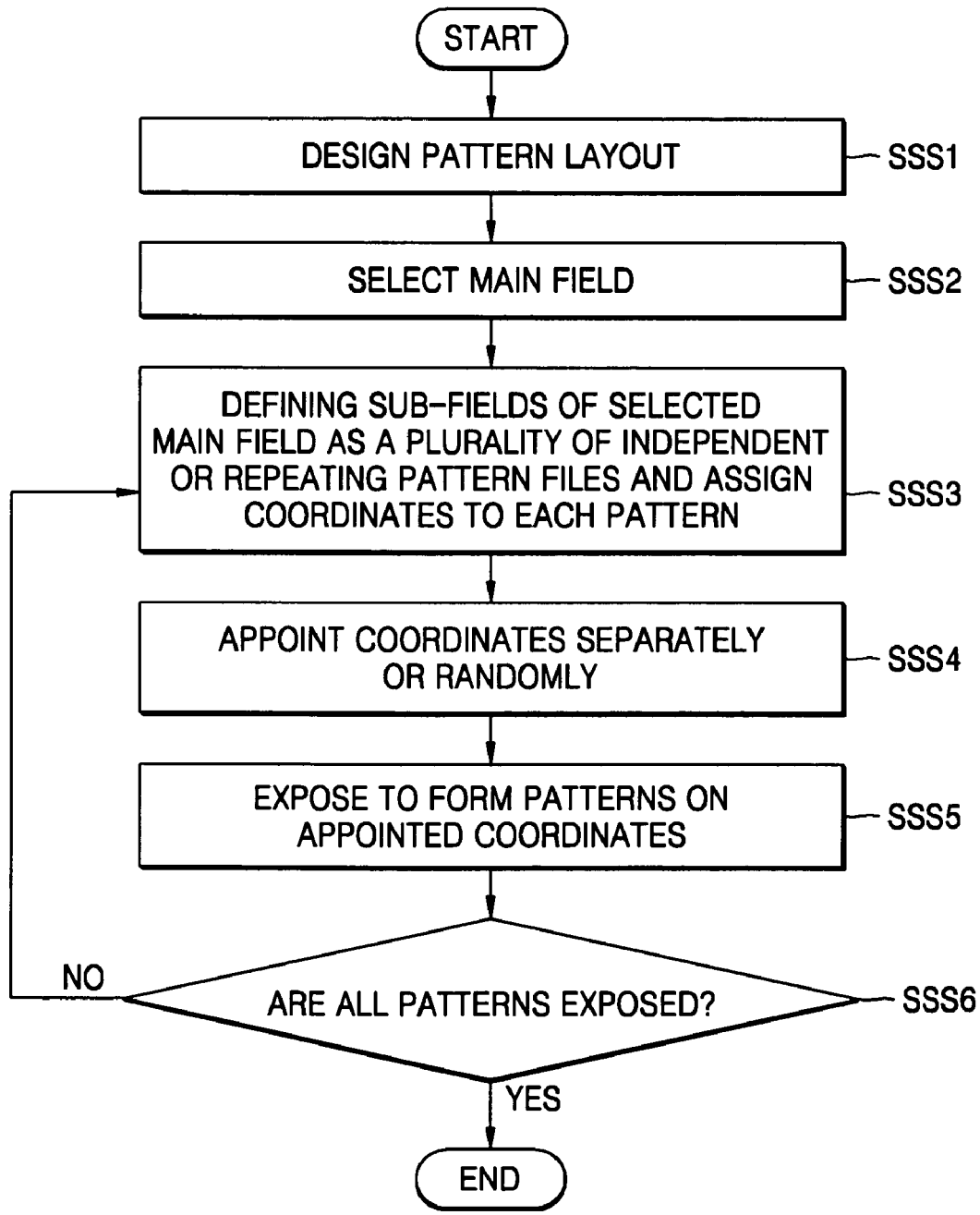

FIG. 10 is a flowchart illustrating the sixth exposing method according to the present invention.

A pattern layout is designed, in SSS1. Here, main fields are defined on a specimen or a photosensitive layer to be exposed, and sub-fields are defined on the main fields.

A main field to be exposed is selected, in SSS2. Here, the main field to be first exposed is selected.

The sub-fields of the selected main field are defined as a plurality of independent or repeating pattern files, and coordinates are assigned to each pattern, in SSS3.

Coordinates are separately or randomly appointed, in SSS4.

By assigning the coordinates, patterns to be exposed are determined. The patterns correspond to the sub-fields, thus SSS4 is the same process as the selection of the sub-fields to be exposed. In the case of randomly appointing the coordinates, random numbers may be generated through performing meshing and grouping by adopting a random function when coding a software program in order to prevent the appointment of the adjacent coordinates sequentially or the appointment of the same coordinates repeatedly.

An exposure is performed to form the patterns on the coordinates that are applied to in SSS4, in SSS5.

Here, since the patterns are the same as the sub-fields, SSS5 is the same process as the exposure of the sub-fields.

It is determined whether all the patterns are exposed, in SSS6.

When all the patterns are formed on the appointed coordinates (Y), the exposure is ended. In other case (N), the processes of SSS4 and SSS5 are repeated until all the patterns are formed on the appointed coordinates.

As described above, a method of exposing using an electron beam according to the present invention differently exposes sub-fields or randomly exposes the sub-fields under conditions of not exposing adjacent sub-fields sequentially and one sub-field repeatedly. In addition, the method of exposing using the electron beam according to the present invention sequentially exposes the sub-fields with a time difference, which is longer than a time difference of a conventional method of exposing using an electron beam. Thus, the method of exposing using the electron beam according to the present invention can improve a proximity effect and the generation of heat by an electron scattering when patterning a photosensitive layer into a predetermined shape by using the electron beam. Thus, the accuracy and the precision of the patterns may be secured. In addition, the method of exposing using the electron beam according to the present invention may be applied to various equipments of exposing using an electron beam. Furthermore, the method of exposing using the electron beam can precisely form fine and complicated patterns, thus the method can realize fine patterns of various shapes.

While the present invention has been particularly shown and described with reference to exemplary embodiments thereof, it will be understood by those of ordinary skill in the art that various changes in form and details may be made therein without departing from the spirit and scope of the present invention as defined by the following claims. For example, sub-fields in a main field may be divided into a plurality of groups, and the groups may be exposed by different methods of exposing. In addition, a method of sequentially exposing two adjacent sub-fields and skipping the next one or two sub-fields may be performed. In other case, a method of exposing using an electron beam may be formed with reference of columns.

What is claimed is:

1. A method of exposing using an electron beam, the method comprising:
   defining main fields on an exposure area of an electron beam exposure target and defining a plurality of sub-fields on the main fields;
   selecting a main field to be exposed;
   selecting at least one sub-field of the selected main field;
   exposing the selected sub-field by using the electron beam; and
   selecting at least one of the other sub-field, which is not adjacent to the previously selected sub-field and not exposed yet, and exposing the sub-field by using the electron beam.

2. The method of claim 1, wherein the selecting of at least one sub-field, the exposing of the selected sub-field, and the selecting of at least one of the other sub-field are repeated until all the sub-fields of the selected main field are exposed using the electron beam.

3. The method of claim 1, wherein the selecting of at least one sub-field of the selected main field includes selecting two adjacent sub-fields.

4. The method of claim 1, wherein the selecting of at least one of the other sub-field includes selecting the other sub-field, which is separated from the previously selected sub-field by at least one sub-field.

5. The method of claim 1, wherein the selecting of at least one of the other sub-field includes selecting a sub-field that is located in a diagonal direction of the previously selected sub-field.

6. The method of claim 1, wherein the plurality of sub-fields form a matrix, and the exposure using the electron beam is performed in the same direction for each row.

7. The method of claim 1, wherein the plurality of sub-fields form a matrix, and the exposure using the electron beam is performed in the opposite directions for two adjacent rows.

8. The method of claim 1, wherein the plurality of sub-fields form a matrix, and the exposure using the electron beam is alternately performed for two adjacent rows.

9. The method of claim 1, wherein a portion of the plurality of the sub-fields are sequentially exposed by using the electron beam.

10. The method of claim 1, wherein the selecting of at least one of the other sub-field includes randomly selecting the sub-fields from the plurality of sub-fields.

11. A method of exposing using an electron beam, the method comprising:
   defining main fields on an exposure area of an electron beam exposure target and defining a plurality of sub-fields on the main fields; and
   sequentially exposing at least a portion of the plurality of sub-fields with a time difference between two sequentially exposed sub-fields, said time difference being longer than a typical time difference in an equipment that exposes two adjacent sub-fields sequentially.

12. The method of claim 11, wherein a portion of the sub-fields that are sequentially exposed are exposed with a time difference same as the typical time difference.

13. The method of claim 11, wherein a potion of the plurality of sub-fields are not sequentially exposed.

14. A method of exposing using an electron beam, the method comprising:
   defining main fields on an exposure area of an electron beam exposure target and defining a plurality of sub-fields on the main fields;
   defining the plurality of sub-fields as a plurality of independent or repeating pattern files and assigning coordinates to the patterns; and
   appointing a first coordinates and exposing sub-field corresponding to the first coordinates by using the electron beam to form a pattern corresponding to the first coordinates.

15. The method of claim 14 further comprising:
   appointing a second coordinates separate and different from the first coordinates;
   exposing sub-fields corresponding to the second coordinates to form a pattern corresponding to the second coordinates; and
   repeating the appointing of the second coordinates and the exposing the sub-fields corresponding to the second coordinates until all the sub-fields are exposed.

16. The method of claim 14, wherein a portion of the plurality of sub-fields are sequentially exposed.

17. The method of claim 14, wherein a portion of the plurality of sub-fields are separately and not repeatedly exposed without the patterns.

* * * * *